United States Patent [19]

Hornbeck

[11] Patent Number: 4,615,595
[45] Date of Patent: Oct. 7, 1986

[54] FRAME ADDRESSED SPATIAL LIGHT MODULATOR

[75] Inventor: Larry J. Hornbeck, Van Alstyne, Tex.

[73] Assignee: Texas Instruments Incorporated, Dallas, Tex.

[21] Appl. No.: 659,387

[22] Filed: Oct. 10, 1984

[51] Int. Cl.$^4$ .............................................. G02F 1/29
[52] U.S. Cl. .................................. 353/122; 350/360
[58] Field of Search ................ 353/122, 120; 350/356, 350/359–361, 266, 269; 340/815.04; 358/231

[56] References Cited

U.S. PATENT DOCUMENTS

| | | |
|---|---|---|
| 3,886,310 | 5/1975 | Goldberg et al. ............. 350/360 X |
| 4,229,081 | 10/1980 | Jones et al. ..................... 350/269 X |
| 4,229,732 | 10/1980 | Hartstein ......................... 340/815.04 |
| 4,441,791 | 4/1984 | Hornbeck ............................ 350/360 |
| 4,492,435 | 1/1985 | Banton et al. ................. 350/269 X |

Primary Examiner—Harry N. Haroian
Attorney, Agent, or Firm—Carlton H. Hoel; James T. Comfort; Melvin Sharp

[57] ABSTRACT

A frame addressed spatial light modulator with pixels arranged along columns of charge transfer devices, and optical projection and processing systems using such modulators are disclosed. The pixels include electrostatically deflectable flaps supported by conducting posts with nodes gated to the charge transfer device. Schlieren, dark field and reverse dark field optics are available.

18 Claims, 27 Drawing Figures

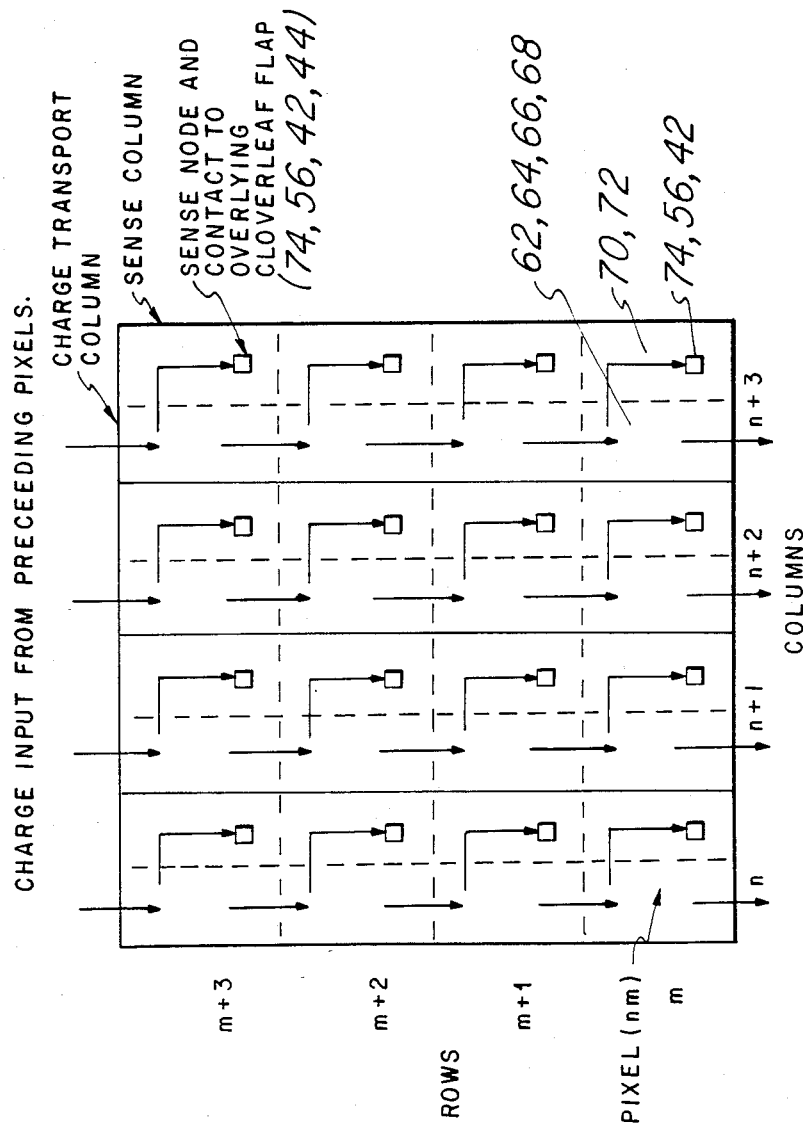

CHARGE PUMP POTENTIAL PROFILES
(BURIED CHANNEL FULLY DEPLETED)

CHARGE PUMP PRESET WAVEFORMS

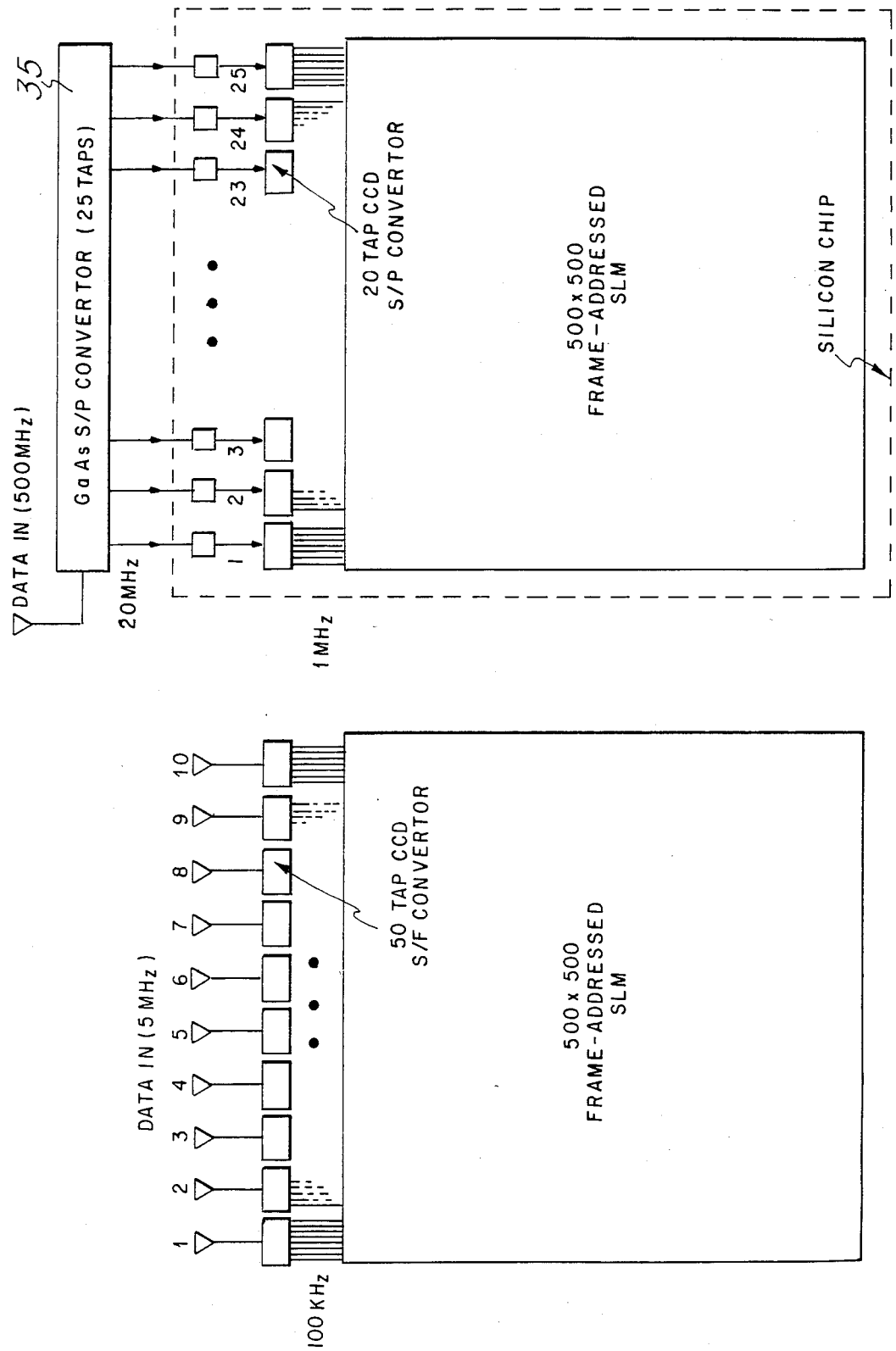

FRAME ADDRESSED SPATIAL LIGHT MODULATOR

BACKGROUND OF THE INVENTION

The present invention relates to spatial light modulators (light valves), and, more particularly, to spatial light modulators with pixels formed of electronically addressable deflectable beams and arranged in a substantially two dimensional array for use in projection and optical processing.

Spatial light modulators (SLM) are transducers that modulate incident light in a spatial pattern corresponding to an electrical or optical input. The incident light may be modulated in its phase, intensity, polarization, or direction, and the light modulation may achieved by a variety or materials exhibiting various electrooptic or magnetoopotic effects and by materials that modulate light by surface deformation. SLMs have found numerous applications in the areas of optical information processing, projection displays, and electrostatic printing. See references cited in L. Hornbeck, 128×128 Deformable Mirror Device, 30 IEEE Tran. Elec. Dev. 539 (1983).

A well known SLM used for large bright electronic displays is the Eidophor, a system which uses an electrostatically dimpled oil film as the active optical element. See, E. Baumann, The Fischer large-screen projection system (Eidophor), 20 J.SMPTE 351 (1953). In this system a continuous oil film is scanned in raster fashion with an electron beam that is modulated so as to create a spatially periodic distribution of deposited charge within each resolvable pixel area on the oil film. This charge distribution results in the creation of a phase grating within each pixel by virtue of the electrostatic attraction between the oil film surface and the suporting substrate, which is maintained at constant potential. This attractive force causes the surface of the film to deform by an amount proportional to the qunatity of deposited charge. The modulated oil film is illuminatd with spatially coherent light from a xenon arc lamp. Light incident to modulated pixels on the oil film is diffracted by the local phase gratings into a discrete set of regularly spaced orders which are made to fall on a schlieren stop consisting of a periodic array of alternating clear and opaque bars by part of the optical system. The spacing of the schlieren stop bars is chosen to match the spacing of the diffracted signal orders at the stop plane so that high optical throughput efficiency is achieved. Light that is incident to unmodulated regions of the light valve is blocked from reaching the projection lens by the opaque bars of the schlieren stop. Images formed of unmodulated areas on the light valve by the schlieren imaging system on the projection screen are therefore dark, while the phase perturbations introduced by he molulated electron beam are converted into bright spots of light at the screen by the schlieren projector. In spite of numerous technical difficulties associated with oil polymerization by electron bombardment and organic vapor contamination of the cathode, this type of oil-film system has been successfully developed to the point that it is the almost universally used system for a total light requirement of thousands of lumens at the screen. However, such systems are expensive, bulky, and have short-lived components.

A number of non-oil-film SLMs have also been developed and include deflectable element types, rotation of plane of polarization types, and light scattering types. These SLM types employ various effedts such as deformation of reflective layers of metal, elastomer, or elastomer-photoconductor, and polarization and scattering of ferroelectrics, PLZT ceramics, and liquid crystals. For example, R. Sprague et al, Linear total internal reflection spatial light modulator for laser printing, 299 Proc. SPIE 68 (1981) and W. Turner and R. Sprague, Integrated total internal reflection (TIR) spatial light modulator for laser printing, 299 Proc. SPIE 76 (1982) and U.S. Pat. No. 4,380,373 describe a system for non-impact printing on a photosensitive medium in which laser light is formed into a line of illumination and passed through a linear array of light modulators and then imaged onto the photosensitive medium. The array is implemented as a total internal reflection spatial light modulator with the electrodes and drive electronics fabricated on an integrated drive element which is placed against the total reflection surface of an electrooptic crystal such as lithium niobate. The localized change in index of refraction produced by the fringing field between each two electordes is read out with schlieren readout optics which image the TIR interface onto the photosensitive medium. This is a one dimensional image, and the photosensitive medium is rotated on a drum beneath the image of the linear array to generate the two dimenesional image (e.g., a page of text) for printing applications. However, the SLM (light valve) is highly susceptible to fabrication problems due to its hybrid nature. The fringing field strength, and hence the amount of light diffracted from modulated pixels, is sensitive to changes in the air gap thickness between the address electrodes and the electrooptic crystal surface of less than one tenth micron. Thus, even very small particles trapped between the crystal and electrode structure could cause illumination nonuniformity problems at the photosensitive medium. The system optical response for pixels located at the boundary between modulated and unmodulated areas of the light valve is also significantly lower than the response for pixels near the middle of a modulated region due to the nature of the addressing technique. A commercially available printer based on this technology has not been introduced to date.

M. Little et al., CCD-Addressed Liquid Crystal Light valve, Proc. SID Symp. 250 (April 1982) describes a SLM with a CCD area array on the front side of a silicon chip and a liquid crystal array on the backside of the chip. Charge is input into the CCD until a complete frame of analog charge data has been loaded; the charge is then dumped to the backside of the chip where it modulates the liquid crystal. This device suffers from severe fixed pattern noise as well as resolution degradation due to the charge spreading from the front-to-back transfer. Another SLM type which may be fabricated in both one and two dimensional arrays is the deformable mirror. Deformable mirrors may be subdivided into three classes: elastomers, membranes, and cantilever beams. In the elastomer approach a metallized elastomer is addressed by a spatially varying voltage that produces surface deformation through compression of the elastomer. Because of the address voltage requirements in the order of one or two hundred volts, the elastomer is not a good candidate for integration with a high-density silicon address circuit. See, generally, A. Lakatos and R. Bergen, TV projection display using an amorphorous-Se-type RUTICON light valve, 24 IEEE Tran. Elec. Dev. 930 (1977).

Membrane deformable mirrors come in a variety of types. One type is essentially a substitute for the oil film of the Eidophor system discussed above. In this system a thin reflective membrane is mounted to the faceplate of a cathode ray tube (CRT) by means of a support grid structure. Addressing is by a raster scanned electron beam as with the Eidophor. The charge deposited on the glass faceplate of the CRT by the electron beam electrostatically attracts the membrane which is held at a constant volatge. This attractive force causes the memebrane to sag into the well formed by the grid structure, thereby forming a miniature spherical mirror at each modulated pixel location. The light diffracted from this type of modulated pixel is concentrated into a relatively narrow cone that is rotationally symmetric about the specularly reflected beam. This type of light valve is thus used with a schlieren stop that consists of a single central obsucration positioned and sized so as to block the image of the light source that is formed by the optical system after specular reflection from unmodulated areas of the light valve. Modulated pixels give rise to a circular patch of light at the schlieren stop plane that is larger than the central obscuration, but centered on it. The stop efficency, or fraction of the modulated pixel energy that clears the schlieren stop, is generally somewhat lower for projectors based on deformable membranes than it is for the oil film Eidophor projector. Further, such membrane deformable mirror systems have at least two major problems. High voltages are required for addressing the relatively stiff reflective membrane, and slight misalignments between the electron beam raster and the pixel support grid structure lead to addressing problems. Such misalignments would cause image blurring and nonuniformity in display brightness.

Another type of membrane deformable mirror is described in L. Hornbeck, 30 IEE Tran. Elec. Dev. 539 (1983) and U.S. Pat. No. 4,441,791 and is a hybrid integrated circuit consisting of an array of metallized polymer mirrors bonded to a silicon address circuit. The underlying analog address circuit, which is separated by an air gap from the mirror elements, causes the array of mirrors to be displaced in selected pixels by electrostatic attraction. The resultant two-dimensional displacement pattern yields a corresponding phase modulation pattern for reflected light. This pattern may be converted into analog intensity variations by schlieren projection techniques or used as the input transducer for an optical information processor. However, the membrane deformable mirror has manufacturability problems due to the susceptibility to defects that result when even small, micron sized paticles are trapped between the membrane and the underlyiong support structure. The membrane would form a tent over these trapped particles, and the lateral extent of such tents is much larger than the size of the particle itself, and these tents would in turn be imaged as bright spots by a schlieren imaging system. A cantilever beam deformable mirror is a micromechanical array of deformable cantilever beams which can be electrostatically and individually deformed by some address means to modulate incident light in a linear or areal pattern. Used in conjunction with the proper projection optics, a cantilever beam deformable mirror can be employed for displays, optical information processing, and electrophotographic printing. An early version with metal cantilever beams fabricated on glass by vacuum evaporation appears in U.S. Pat. No. 3,600,798. This device has fabrication problems which include the alignment of the front and back glass substrates arising from the device's nonintegrated architecture.

A centilever beam deformable mirror device is described in R. Thomas et al, The Mirror-Matrix Tube: A Novel Light valve for Projection Displays, 22 IEEE Tran. Elec. Dev. 765 (1975) and U.S. Pat. Nos. 3,886,310 and 3,896,338. This device is fabricated as follows: a thermal silicon dioxide layer is grown on a silicon on sapphire substrate; the oxide is patterned in a cloverleaf array of four cantilever beams joined in the middle. The silicon is isotropically wet etched until the oxide is undercut, leaving within each pixel four oxide cantilever beams supported by a central silicon support post. The cloverleaf array is then metallized with aluminum for reflectivity. The aluminum which is deposited on the sapphire substrate forms a reference grid electrode which is held at a DC bias. The device is addressed by a scanning electron beam which deposits a charge pattern on the cloverleaf beams causing the beams to be deformed by electrostatic attraction towards the reference grid. Erasure is achieved by negatively biasing a closely spaced external grid and flooding the device with low-energy electrons. A schlieren projector is used to convert the beam deformation into brightness variations at the projection screen. A significant feature of this device is the cloverleaf geometry which leads to beam deflection in a direction rotated forty-five degrees from the openings between the beams; this permits use of a simple cross shaped schlieren stop to block out the fixed diffraction background signal without attenuating the modulated diffraction signal. The device was fabricated with a pixel density of five hundred pixels per inch with beams deflectable up to four degrees. The optics employed a 150 watt xenon arc lamp, reflective schlieren optics and a 2.5 by 3.5 foot screen with a gain of five. Four hundred TV lines of resolution were demonstrated with a screen brightness of thirty-five foot-lamberts, a contrast ratio of fifteen to one, and a beam diffraction efficiency of forty-eight percent. Write times of less than 1/30 second were achieved and erase times were as short as 1/10 of the write time. However, the device has problems, including degradation of resolution from scanning errors, poor manufacturing yield, and no advantage over conventional projection cathode ray tubes. That is, the scan-to-scan positioning accuracy is not high enough to reproducibly write on individual pixels. The resulting loss of resolution forces at least a four fold increase in the number of pixels required to maintain the same resolution compared to comparably written phosphor. Also, the device yield is limited by the lack of an etch stop for the cloverleaf support post, the wet etching of the beams leading to beam breakage, and the need to evaporate normally tensile aluminum in a state of zero stress on the oxide beams. Further, the device offers no apparent cost or performance advantage over conventional projection CRTs.

Cantilever beam deformable mirrors integrated on silicon with addressing circuitry, thus eliminating the electron beam addressing with its high voltage circuitry and vacuum envelpoes of the previously described cantilever device, appear in K. Petersen, Micromechanical light modulator array fabricated on silicon, 31 App. Phys. Lett. 521 (1977) and U.S. Pat. No. 4,229,732. The first of these references describes a 16 by 1 array of diving board-shaped cantilever beams fabricated as follows: an epitaxial layer of $<100>$-oriented silicon (either p or n) of thickness of about 12 microns is grown on a p+ substrate (or buried layer); the epilayer is oxidized to a thickness of about 0.5 micron and covered with a Cr-Au film of thickness about 500 A. The Cr-Au is etched away to form contact pads and address lines and to define the diving board metallization. The oxide is etched away in a comb pattern around the metallization in a second masking step. Finally, the silicon itself is etched in a solution of ethylenediamine and pyrocatechol at 120 degrees C. If the proper orientation of the mask with respect to the crystalline axes is maintained, the metal-coated oxide diving boards will be undercut by the etch and freed from the silicon. Since the etch is anisotropic, further lateral etching will be stopped by the <111> planes defining the rectangular envelope of the comb pattern. In addition, the etchant is inhibited by p+ material, so that depth of the well beneath the diving boards is defined by the thickness of the epilayer. When a dc voltage is applied between the substrate and the diving board metallization, the thin oxide diving board will be electrostatically deflected downward into the etched well. Diving boards of length 106 microns and width 25 microns showed a threshold voltage of about 66 volts.

The second reference (U.S. Pat. No. 4,229,732) describes devices fabricated in a manner similar to the diving board device (a buried p+ layer as an etch stop for forming the wells underneath metallized silicon dioxide cantilever beams) but has a different architecture; namely, the cantilever beams are in the shape of square flaps hinged at one corner, the flaps form a two dimensional array instead of the one dimensional row of diving boards, and the wells underneath the flaps are not connected so that addressing lines for the flaps may be formed on the top surface of the silicon between the rows and columns of flaps. Of course, the corner hinging of the flaps derives from the cloverleaf architecture of U.S. Pat. Nos. 3,886,310 and 3,896,338, but the full cloverleaf architecture could not be used because this would preclude the surface addressing lines since cloverleaf flaps are hinged to a central post isolated from the silicon surface. Further, these devices have problems including poor resolution and low efficiency due to density limitations and the small fractional active area, low manufacturing yield, degradation of contrast ratio due to diffraction effects from the address circuitry, and residual image due to the charging effects of the oxide flap. More particulary, the addressing circuitry is squeezed around the active area (flaps) because no option exists of placing the address circuitry under the active area due to the wells being formed by etching away the epilayer down to the p+ etch stop. Thus the active area is reduced substantially together with the diffraction efficiency. This means more lamp power is required for the same screen brightness. Because the address circuitry requires additional area, the pixel size is increased far beyond the flap area with a resulting decrease in achievable resolution. The wet etching required to form the wells leads to low electrical and mechanical yield; indeed, wet cleanups, such as after dicing into chips, destroy flaps and diving boards because during the spin-rinse/dry cycle the water trapped under the beam breaks the beam as it is spun from the surface. If the water is instead evaporated from the surface it leaves behind surface residues which can increase surface leakage currents contributing to erratic device operation. Also, the addressing circuitry being on the silicon surface is exposed to the incident light to be modulated and creates unwanted diffraction effects from the transistor gates plus lowers the contrast ratio. In addition, light leakage into the address structure produces photogenerated charge and reduces storage time. Lastly, the oxide/metal flap has the insulating side facing the well and will charge up due to the intense electric fields which exist across the well; this produces a residual ("burn-in") image. The AC drive required to eliminate this residual image problem cannot be supplied by the NMOS drive circuitry described. Further, if the flap is deflected past the maximum stable deflection, then it will collapse and stick to the bottom of the well. Thus, voltages over the collapse voltage must be absolutely avoided.

A variation of the cantilever beam approach apppears in K. Petersen, Silicon Torsional Scanning Mirror, 24 IBM J. Res. Devp. 631 (1980) and M. Cadman et al, New Micromechanical Display Using Thin Metallic Films, 4 IEEE Elec. Dev. Lett. 3 (1983). This approach forms metallic flaps which are connected to the surrounding reflective surface at two opposed corners and operate by twisting the flaps along the axes formed by the connections. The flaps are not formed monolithically with the underlying addressing substrate, but are glued to it in a manner analogous to the deformable membrane devices mentioned above.

The cantilever beam references discussed above all suggest that schlieren projection optical systems be used with the cantilever beam devices. But such systems have limitations in terms of attainable optical performance. First, the aperture diameter of the imaging lens must be larger than is necessary to pass the signal energy alone. Hence the speed of the lens must be relatively high (or, equivalently, its f-number must be relatively low) to pass all the signal energy around the central schlieren stop obscuration. In addition, the signal passes through the outer portion of the lens pupil in this imaging configuration. Rays of light emanating from any given point on the SLM and passing through the outermost areas of an imager lens pupil are the most difficult ones to bring to a well-corrected focus during the optical design of any imaging lens. When the outer rays are brought under good control, the rays passing through the center of the imager lens are automatically well-corrected. Hence, a greater level of optical design complexity is required of the imaging lens. Second, the field angle over which the imaging lens can form well-corrected images of off-axis pixels on a cantilever beam SLM is also restricted. Any lens design task involves a compromise between the speed of the lens and the field angle it can cover with good image quality. Fast lenses tend to work over small fields, while wide angle lenses tend to be relatively slow. Since the schlieren imager must be well-corrected over its entire aperture, and since this aperture is larger in diameter than is required to pass the image forming light, the field angle that can be covered by the lens is smaller than it could be if a different imaging configuration could be devised in which the signal was passed through the center of an unobscured, smaller diameter lens. Lastly, for an imager lens having a given finite speed, the use of the schlieren stop configuration also limits the size of the light source that can be utilized. This in turn limits the irradiance level that can be delivered to a projection screen or a photoreceptor at the image of a deflected pixel. This irradiance level, or the delivered power per unit area, depends on the product of the radiance of the light source, the transmittance of the optical system, and the solid angle of the cone of image forming rays of light. The source radiance is determined only by the particular lamp that is used. The optics transmittance depends on the stop efficiency for the particular SLM/schlieren stop configuration and surface transmission losses. But the solid angle of the image forming cone of light is directly proportional to the area of the imager lens pupil that is filled with signal energy. The use of a schlieren stop that obscures the central area of the imager lens pupil limits the usable pupil area and thus the image plane irradiance level that can be obtained for a lens of a given speed and a source of a given radiance; this is in addition to the fundamental irradiance limitation that the maximum usable cone of light has an opening angle equal to the beam deflection angle.

Thus the known cantilever beam SLMs have problems including addressing circuitry limiting the fractional active area of the pixels, processing steps giving low yields, sensitivity to film stress in the beams, beam insulator charging effects, lack of overvoltage protection against beam collapse, performance not compatible with low cost optics design, and low contrast ratio due to non planarized addressing circuitry on the surface.

SUMMARY OF THE INVENTION

The present invention provides monolithic spatial light modulators with an essentially two dimensional array of pixels arranged into columns with charge transfer of signal charge packets along the columns, each pixel including one or more electrostatically deflectable, reflecting flaps which can be charge addressed, such addressing simultaneously transferring signal charge packets from the columns to and affecting all pixels. Preset of the pixels for accepting a frame of signal charge packets is by charge pumping of the previous frame signal charge packets into the substrate in a preferred embodiment. The charge transfer along the columns is by a buried channel, virtual phase CCD in a preferred embodiment. Each pixel includes a sense node with a support post to which a cloverleaf of four deflectable flaps are hinged, and each sense node is connected to a charge transfer column by a gate, in a preferred embodiment.

BRIEF DESCRIPTION OF THE DRAWINGS

FIG. 5 illustrates the intercolumn aspect of the frame addressing of a first preferred embodiment frame addressed spatial light modulator;

FIGS. 10A-B are schematic plan views of alternative data input converters.

DESCRIPTION OF THE PREFERRED EMBODIMENTS

Preferred embodiments of the inventive deflectable beam spatial light modulators (SLMs) typically include two dimensional arrays of pixels, each pixel individually addressable and containing one or more electrostatically deflectable reflecting beams; the pixels are combined in the form of monolithic silicon based chips. The chips are fabricated by processing silicon wafers, dicing the wafers into chips, followed by processing the individual chips. The chips will vary in size depending upon the application; for example, a 500 by 500 array of pixels (which could be a component of an image projection system) may be fabricated on a chip about 550 mils by 600 mils, including addressing circuitry, with pixels about 25 microns square. The SLMs operate by reflecting light off of the pixels, the reflected light is modulated by varying the deflection of the beams with electrical signals.

Figure 1A:
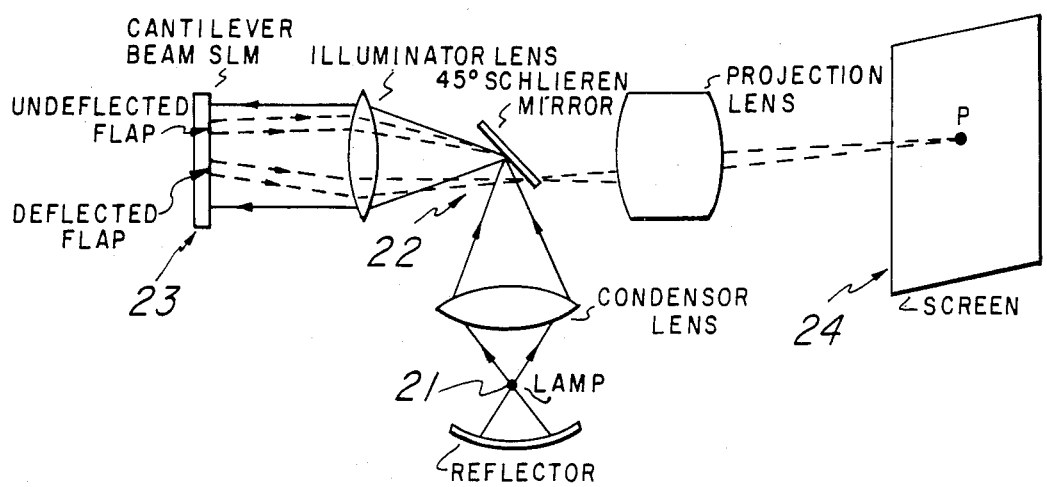
FIGS. 1A-C are schematic views of preferred embodiment projection systems and optical processing systems incorporating preferred embodiment frame addressed spatial light modulators.
Figure 1B:
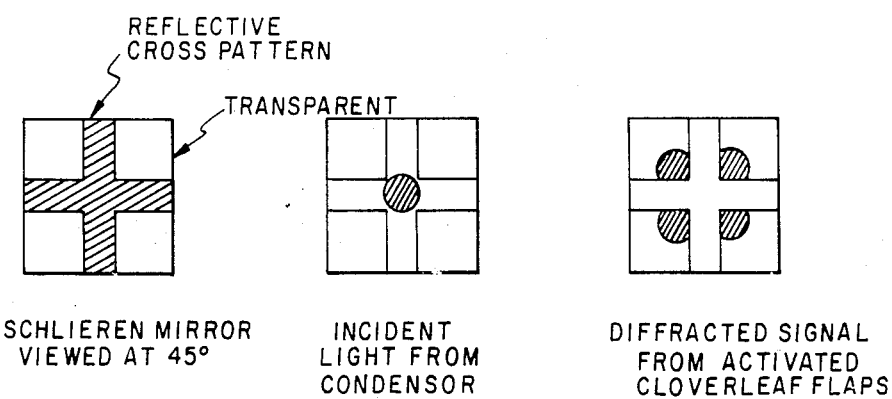

The SLMs typically include on-chip address circuitry and, for the projection system example, while a frame is being imaged by deflecting beams, the data for the next frame is being loaded into the SLM for transfer to the pixels. FIGS. 1A-B illustrate schematically a first preferred embodiment projection system which would operate as follows. Light from lamp 21 is focussed on schlieren mirror 22 (the left panel of FIG. 1B shows the cross-shaped pattern of the reflective portion, and the middle panel shows the image lamp 21—all on the reflective portion). Schlieren mirror 22 reflects the light onto two dimensional SLM 23; SLM 23 has pixels including deflectable beams in the shape of cloverleaves of flaps oriented to bend at 45 degrees relative to the perimeters of the flaps which are parallel to the horizontal and vertical in FIG. 1A (see FIG. 2B for a plan view showing line 43 along which flaps 44 bend). Light reflected from undeflected flaps retraces its path and is stopped by schlieren mirror 22; whereas, light reflected from deflected flaps intercepts schlieren mirror 22 in the transparent portion (see right panel of FIG. 1B and note that the reflected light appears in the four quadrants at the 45 degree to the axes line because of the bending of the flaps at 45 degrees to the flaps perimeters) and is transmitted onto projection screen 24. Note that projection screen 24 and SLM 23 are conjugates in the optical system, so that projection screen 24 is an image of SLM 23 with bright spots corresponding to deflected flaps and dark spots corresponding to undeflected flaps. Also, the brightness of a spot on projection screen 24 depends on the fraction of the light reflected by the corresponding flap that is transmitted by schlieren mirror 22, which in turn depends on the degree of deflection of the flap. Thus analog operation is possible. Lastly, schlieren mirror 22 has a cross shaped reflective portion to block light diffracted by the perimeters of the flaps; if such diffracted light were not a problem, then schlieren mirror 22 would just have a central reflective portion.

Figure 1C:
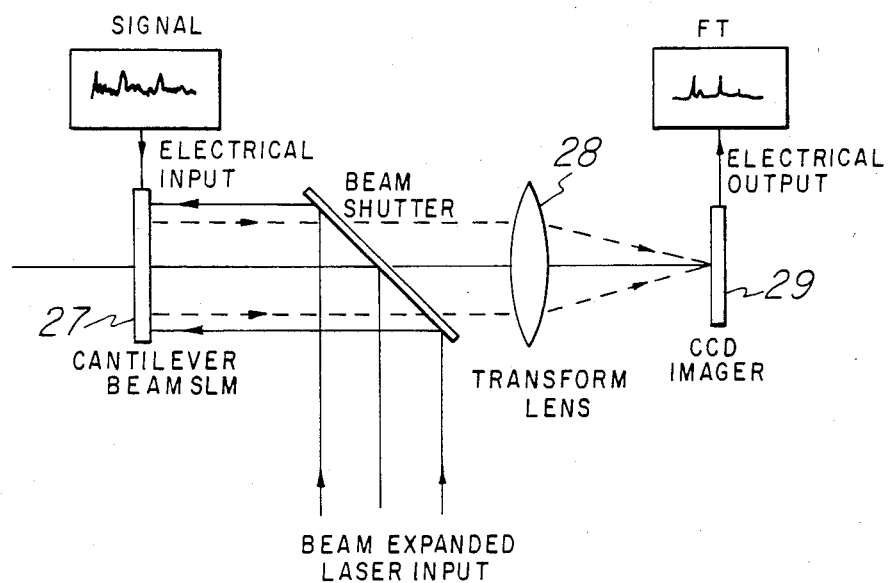

FIG. 1C is a schematic view of a preferred embodiment optical processing system for computing Fourier transforms; in particular, a two dimensional image to be transformed is read into SLM 27 which is illuminated by a laser beam, the diffracted light is imaged by lens 28 on CCD imager 29 and read out, the output being the transform of the input due to the Fraunhofer diffraction involved.

Figure 2A:
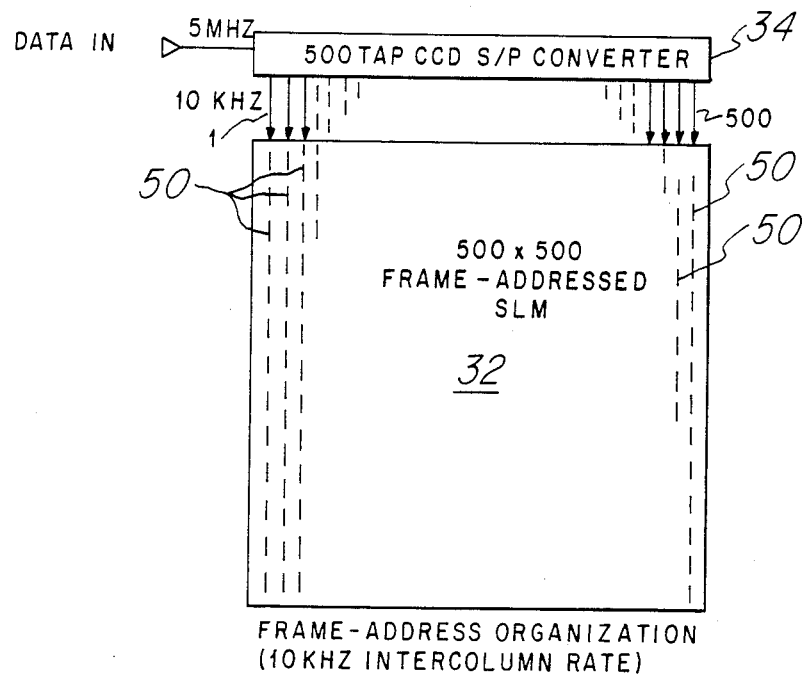
FIGS. 2A-C are schematic plan and equivalent circuit views of preferred embodiment frame addressed spatial light modulators.
Figure 2C:
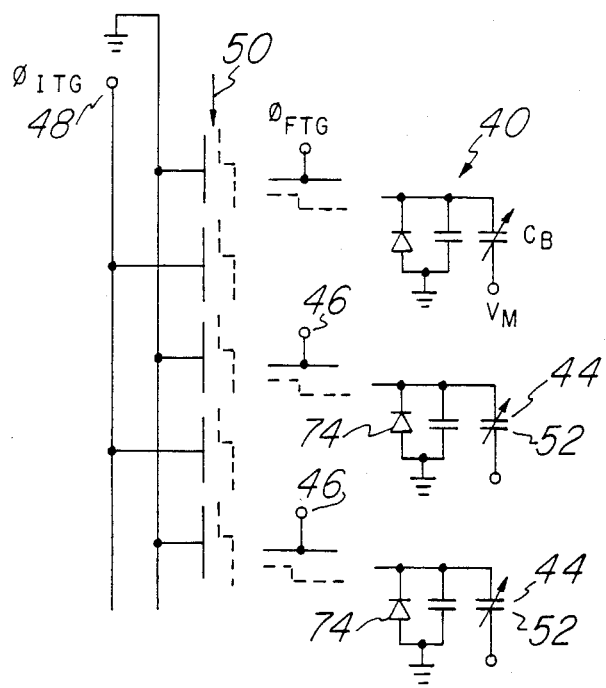
Figure 2B:
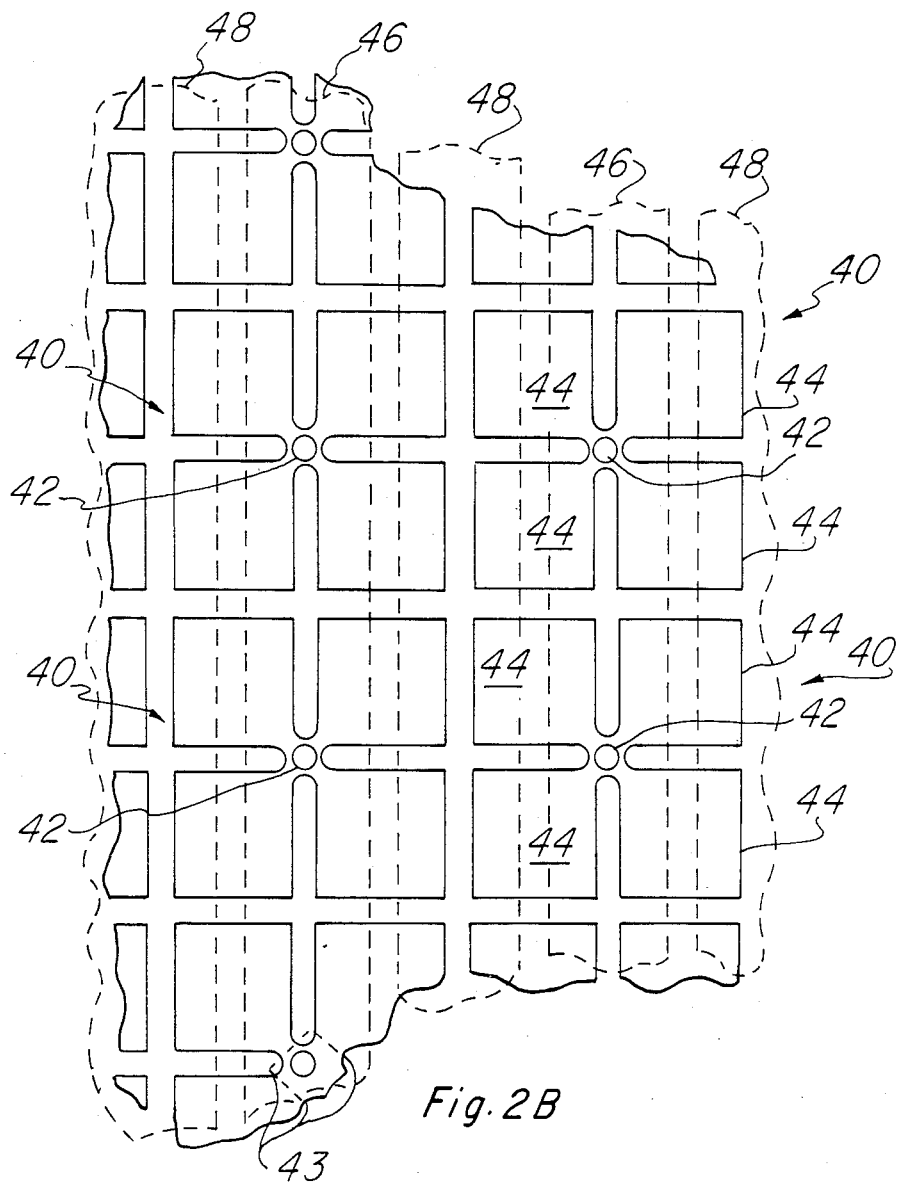

A first preferred embodiment frame addressed SLM with 500 by 500 pixels is shown in schematic plan and equivalent circuit views in FIGS. 2A-C. As shown in FIG. 2A, the 500 by 500 array of pixels 32 is addressed by serial data fed into CCD serial to parallel converter 34 which outputs to the 500 columns of pixels in array 32. FIG. 2B is a closeup plan view of pixels in array 32 and illustrates the cloverleaf design of the deflectable beams; in particular, each pixel 40 includes (i) a central supporting post 42 (oriented perpendicular to the plane of the drawing) which supports four square flaps 44 of reflecting material, each flap 44 has one corner hinged to post 42 and is deflectable at the hinge by bending along line 43, (ii) a common frame transfer gate 46, (iii) a common intercolumn transfer gate 48, and (iv) buried channel CCD regions under gates 46 and 48 and not shown in FIG. 2B but described in connection with FIGS. 3A-E. Note that all of the flaps 44 lie in and essentially fill the plane of the drawing in FIG. 2B; this implies that light directed onto array 32 will all fall on optically active area and thus reverse dark field optics can be used, as well as schlieren and dark field optics.

FIG. 2C is a heuristic equivalent circuit for array 32; flaps 44 in pixel 40 form one plate of a capacitor, the other plate being ground plane 52 (see FIGS. 3A-E) beneath the flaps, and operate as follows: Signal charge packets are output from converter 34's 500 taps and transferred down CCD buried channels 50 by intercolumn transfer gates 48 (the channels 50 are illustrated as potential barriers and wells with dotted lines and the transfer gates (clocked gates) 48 and virtual gates (grounded) are illustrated as capacitor plates over the potential barriers and wells) until an entire frame of signal charge packets is held by the virtual potential wells of buried channels 50, then frame transfer gates 46 transfer the signal charge packets from buried channels 50 to pixels 40 (again, the transfer gates are illustrated as capacitor plates and the pixel potential barrier and well are illustrated by the dotted lines), the signal charge is held in pixel 40 on node 74 and four flaps 44 which connect to the potential well, a capacitor is formed by the four flaps 44 as one plate and ground plane 52 as the other, and the electrostatic force between these capacitor plates causes flaps 44 to deflect towards ground plane 52 and thereby modulate light reflecting off of flaps 44. Note that the capacitor formed by the four flaps 44 and ground plane 52 is a variable capacitor and that stray capacitance also occurs in pixel 40 plus the junction between node 74 and the substrate, thus, in FIG. 2C pixel 40 is represented as a variable capacitor in parallel with a fixed capacitor and a diode. Note that ground plane 52 is insulated from and may be biased with respect to the substrate, as shown in FIG. 2C. Further, if ground plane 52 were omitted, then the variable capacitor would be formed with one plate again flaps 44 and the other plate being essentially gates 46 and 48. Such use of gates 46 and 48 as one of the capacitor plates would require that the period of the clocking pulses on gate 48 be small with respect to the mechanical response time of flaps 44 to avoid the clocking pulses appearing in the output.

Figure 3A:
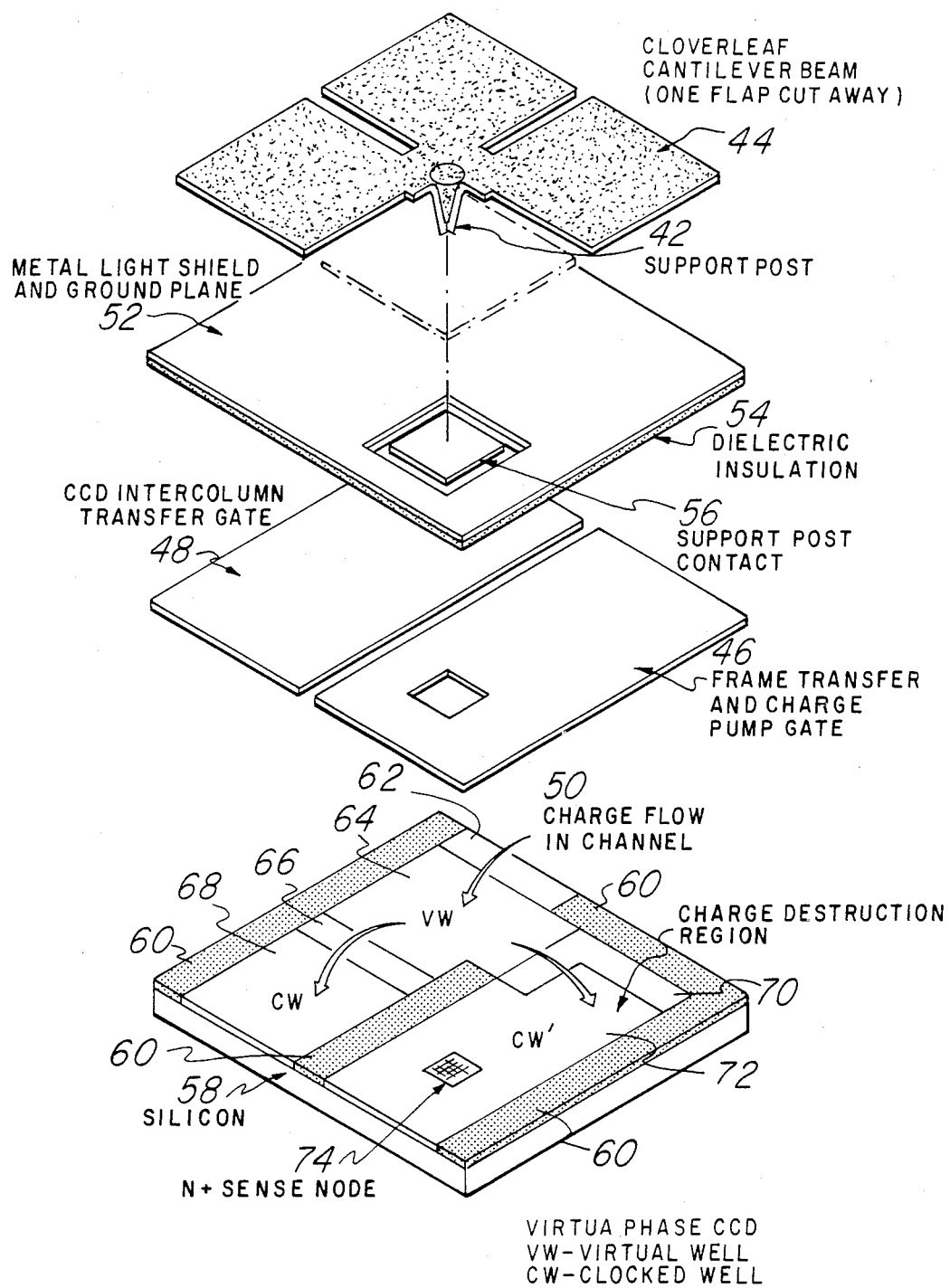
FIGS. 3A-E are schematic perspective, plan, and cross sectional elevation views of a pixel of a first preferred embodiment frame addressed spatial light modulator.

FIGS. 3A-E are exploded perspective, plan, and three cross sectional elevation views of pixel 40, respectively. FIG. 3A shows pixel 40 to include support post 42, four flaps 44 hinged to post 42, ground plane 52, insulating layer 54, post 42 contact 56, intercolumn transfer gate 48, frame transfer gate 46, silicon substrate 58, channel stops 60 in substrate 58, virtual barrier region 62, virtual well region 64, clocked barrier region 66, clocked well region 68, second clocked barrier region 70, second clocked well region 72, and sense node region 74. The insulating layer 76 between substrate 58 and transfer gates 46 and 48 has been omitted for clarity, and all of the regions 60-72 are understood to be heuristic representations of standard virtual phase buried channel CCD regions and formed in substrate 58 by implant doping, as briefly described below.

Figure 3B:
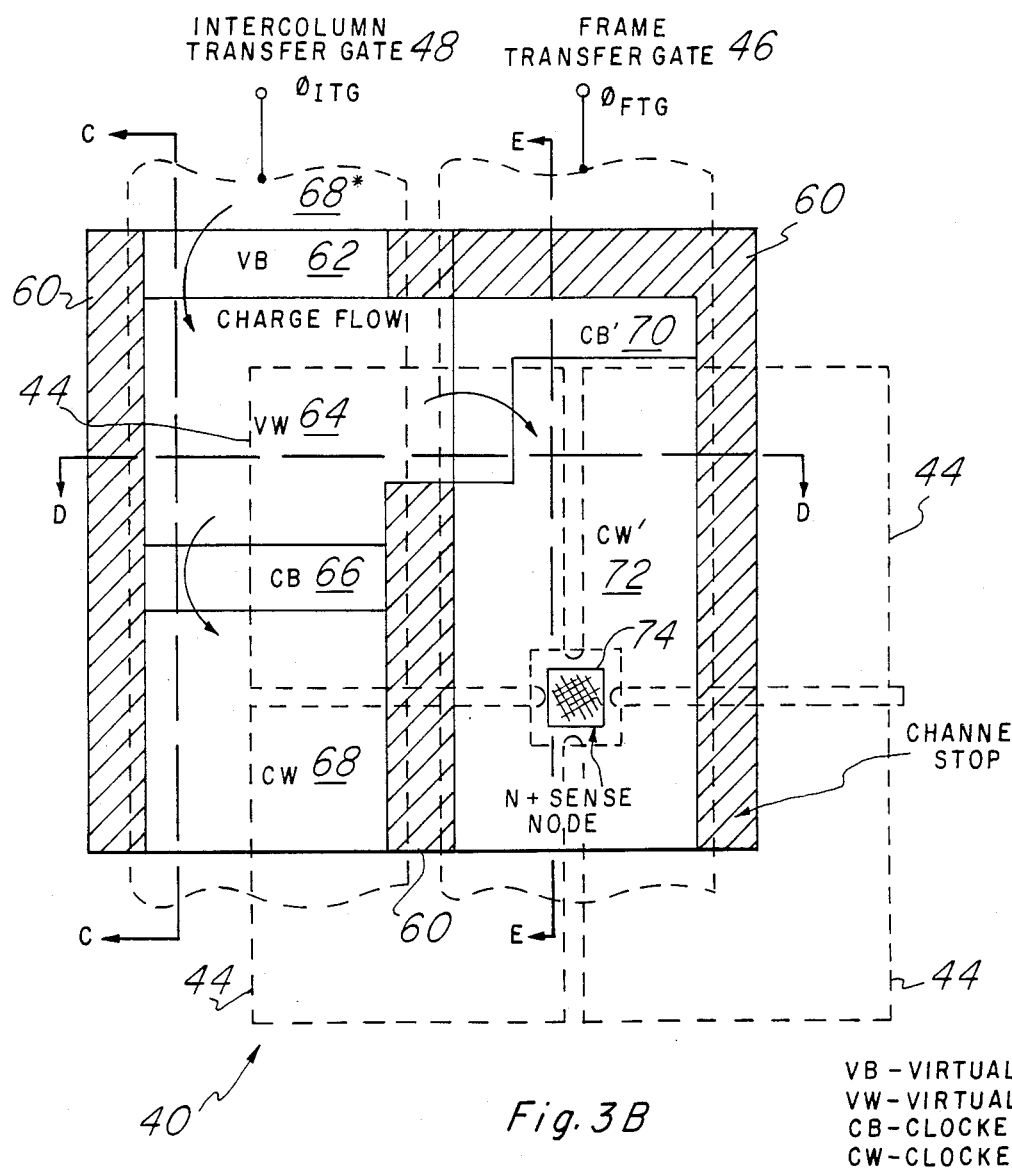
Figure 3C:
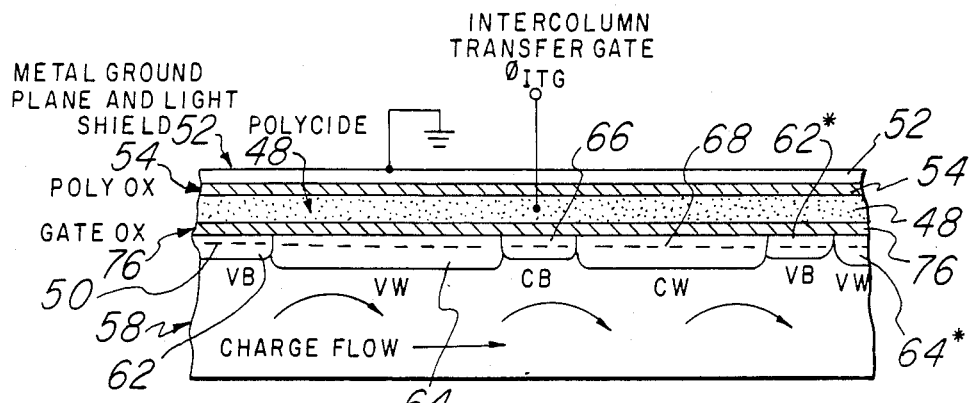
Figure 3D:
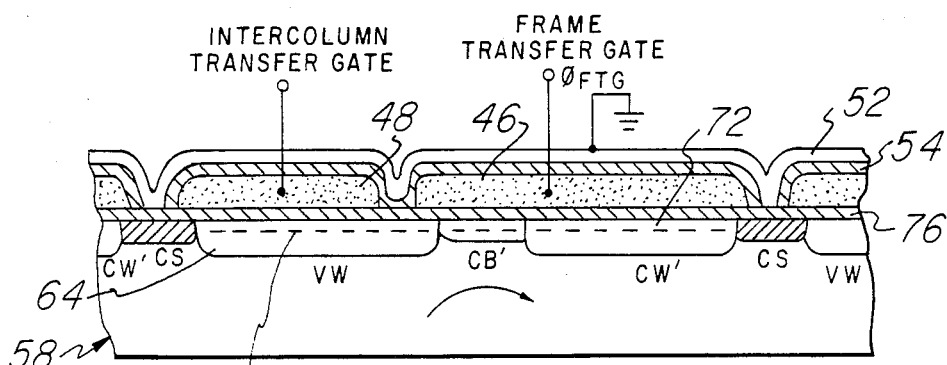
Figure 3E:
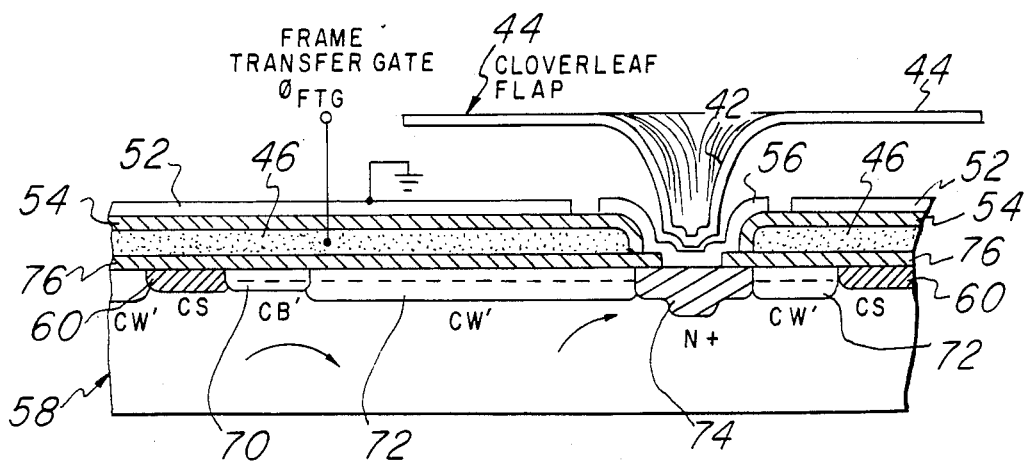

FIG. 3B in plan view shows the arrangement of the virtual phase CCD regions 60-72 plus sense node region 74, the transfer gates 46 and 48, and the four flaps 44 for a single pixel 40; the arrows indicated the direction of charge packet flow during operation, as explained below. FIGS. 3C-E show cross sections along lines C—C, D—D, and E—E, respectively, in FIG. 3B. Thus, FIG. 3C shows the approximate center of buried channel 50 along which signal charge packets are transferred from converter 34; FIG. 3D shows the transfer from buried channel 50 to clocked well region 72; and FIG. 3E shows the signal charge packet flowing from clocked well region 72 onto node 74, contact 56, support post 42, and flaps 44. This operation will be described in detail in connection with FIGS. 5-8. Note that the use of virtual phase CCD structure permits a single transfer gate 48 for transferring charge packets down the columns and a single transfer gate 46 for dumping the charge packets from the columns into the clocked wells and nodes under the cloverleaves of flaps. Also, the transfer gates 46 and 48 need not overlap, so the transfer gates can be fabricated from a single level of metallization and consist of an interdigitated pair of column electrodes. Metal light shield and ground plane 52 between the transfer gates 46 and 48 and the cloverleaf flaps 44 prevents light leakage into the address circuitry and feedthrough between the flap and gates.

Typical dimensions for pixel 40 include 12 to 25 micron long sides for flaps 44, 1.0 to 2.5 micron gap between flaps 44 and ground plane 52, 1.0 to 2.0 micron diameter support post 42, 1.0 micron wide gap between adjacent flaps 44 (both for flaps within the same pixel and flaps in adjacent pixels), 1,200 A thick flaps 44, 1,200 A thick ground plane 52, 2,500 A thick gates 46 and 48, 1,200 A thick insulator 76, and 200 to 4,000 A deep implanted regions 60-72. Of course, the lateral dimensions of the implanted regions and the transfer gates depends upon the dimensions of flaps 44.

Substrate 58 is <100> oriented p silicon with a buried channel blanket phosphorus implant. Flaps 44, post 42, contact 56, and ground plane 52 are aluminum, insulating layers 54 and 76 are oxide, gates 46 and 48 are polycide, and node 74 is doped n+. The regions 60-72 are the usual used in virtual phase buried channel CCD for an n channel device, thus channel stops 60 are boronimplanted p+, virtual regions 62 and 64 are deep phosphorus implants with a shallow high dose boron implant connecting to channel stops 60 for surface energy level pinning, heavier phosphorus implants to separate the well 64 from the barrier 62, and clocked regions 66 and 68 are just the buried channel blanket phosphorus implant with a shallow high dose arsenic implant to define the well 68 from the barrier 66.

Figure 4A:
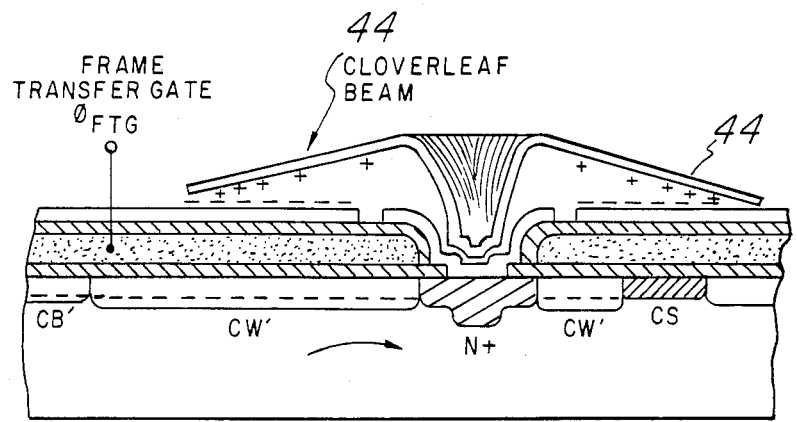
FIGS. 4A-B show the deflection of a beam schematically in cross section and the amount of deflection as a function of voltage.
Figure 4B:
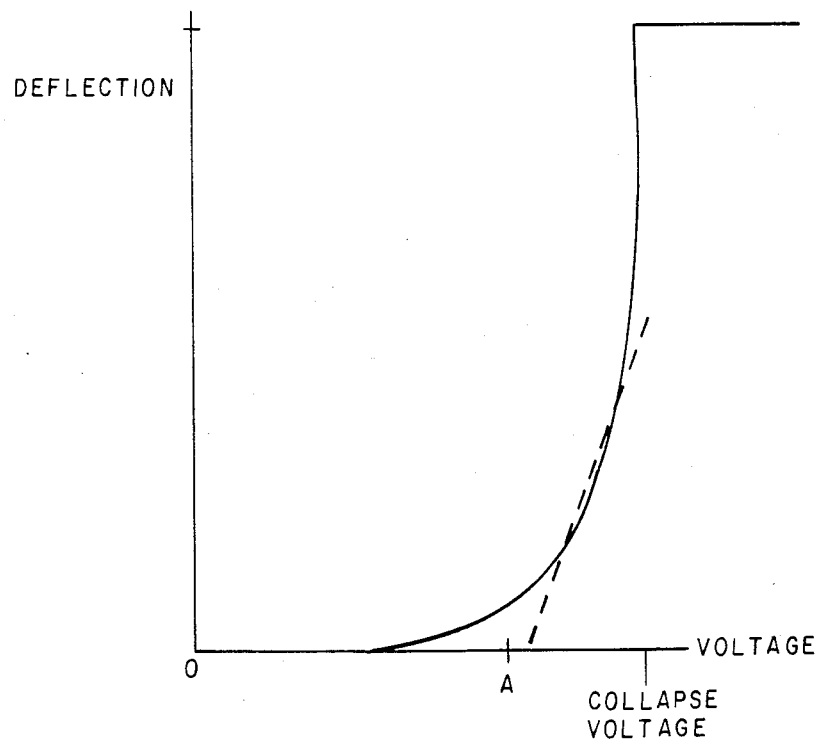

FIG. 4A illustrates the deflection of flaps 44 to ground plane 52 due to the electrostatic force of attraction between the portion of the signal charge packet on flaps 44 and the induced image charge in ground plane 52. The voltage between flaps 44 and ground plane 52 is the usual quotient of the charge on flaps 44 divided by the capacitance of flaps 44/ground plane plane 52. For voltages in the range of 20 to 25 volts, the deflection is in the range of 2 to 4 degrees (approximately 1.0 micron vertical movement by the corner of flap 44 farthest from the hinge at post 42 for a flap 44 with a side length of 20 microns and 2 degrees of deflection). Note that the deflection is a highly nonlinear function of the voltage because the restoring force generated by the bending of the hinge is approximately a linear function of the deflection but the electrostatic force varies roughly as the logarithm of the reciprocal of the distance between the closest corner of flap 44 and ground plane 52 if the effects of capacitance variance are ignored. FIG. 4B illustrates the dependence of the deflection on voltage; the voltage at which flap 44 becomes unstable and bends all the way to ground plane 52 is called the collapse voltage. For voltages somewhat less than the collapse voltage the deflection is roughly a linear function of the voltage (see the dotted line in FIG. 4B) and this is the analog operating region. Note that biasing ground plane 52 with respect to substrate 58 permits operation in the analog region with small signal voltages; for example, biasing ground plane 52 to the negative of voltage A in FIG. 4B yields a slight deflection even for zero signal voltage and maximum deflection for a signal voltage equal to the collapse voltage minus A.

Charge addressing for array 32 is shown schematically in FIG. 5 for a few pixels. Charge transport columns (pixel regions 62, 64, 66, 68) consisting of CCD shift registers are interleaved with sense columns (pixel regions 70, 72) which sense the charge and convert it into a drive voltage for the overlying cloverleaf deflectable flaps. Data is fed into a 500 tap CCD serial to parallel converter 34 at a 5 MHz rate. As each row is loaded into converter 34, it is dumped in the form of charge packets into the charge transport columns. The serial to parallel conversion occurs at a 10 KHz rate and hence the intercolumn rate is 10 KHz. As each succeeding row is loaded and dumped into the charge transport column, charge from the preceding row moves down one row within the intercolumn region, as illustrated by the straight vertical arrows. When one complete frame of charge data has been loaded into the intercolumn region, the sense node is preset to a fixed voltage level. Charge from all of the rows is then dumped in parallel (bent arrows in FIG. 5) onto the sense nodes, causing their voltages levels to change according to the amount of charge. The overlying cloverleaf flaps are then deflected according to the magnitude of the sense node voltage. Immediately following the parallel dump of charge onto the sense nodes, data for the first row of the next frame is fed into converter 34. As the next frame of charge data is loaded into the intercolumn region, the previous frame of data is used to modulate light incident on the cloverleaf flaps 44. In this fashion the cloverleaf flaps 44 continuously modulate light except for a brief period once each frame when all pixels of the array are simultaneously updated.

Figure 6:
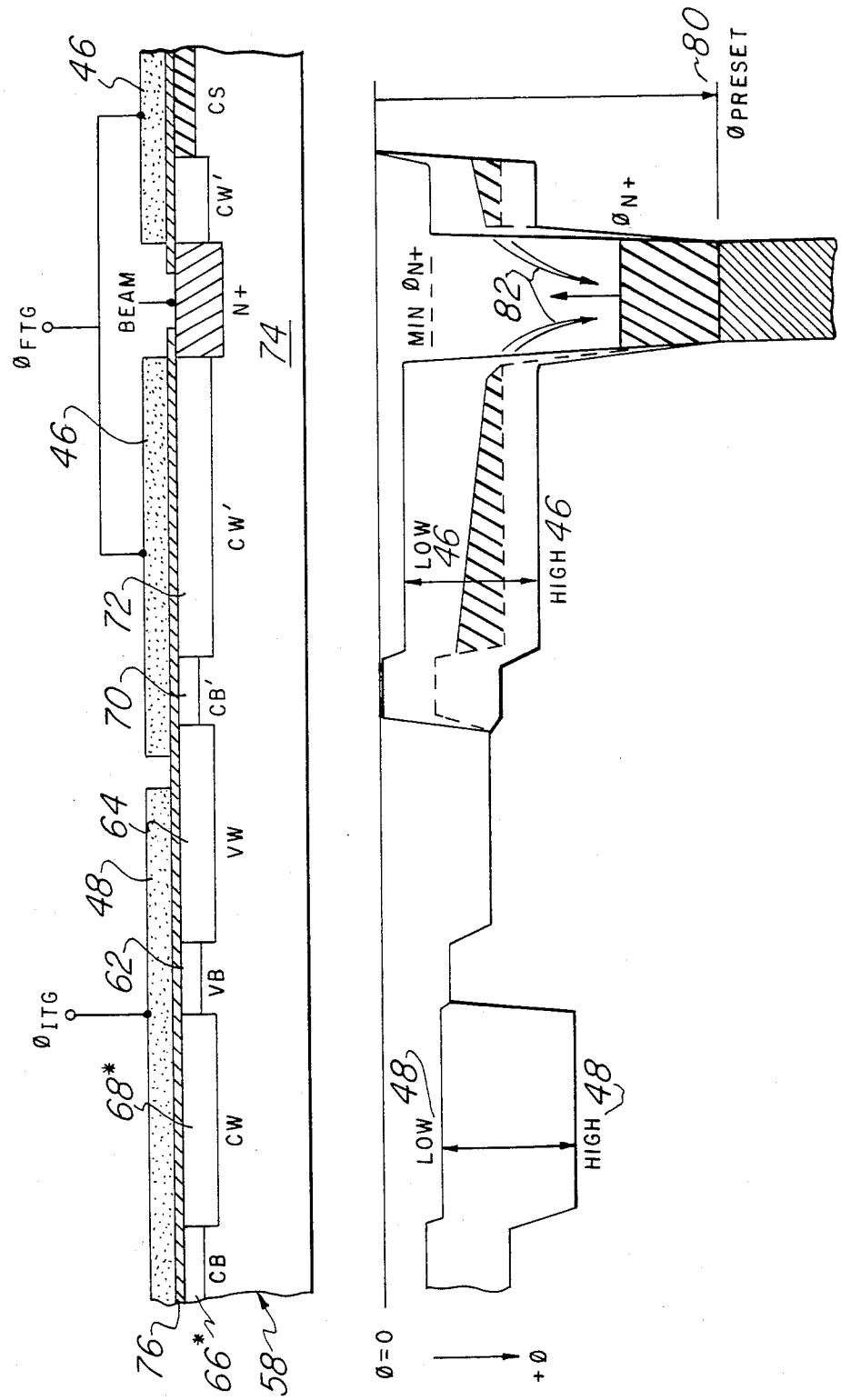
FIG. 6 illustrates the buried channel potential profiles for electrons during operation of the first preferred embodiment frame addressed spatial light modulator.

Operation of the intercolumn virtual phase CCD can be understood by reference to FIG. 6 which shows a cross section of a pixel along the path of a charge packet being dumped into the pixel (left to right in FIG. 6 corresponds to a straight vertical arrow followed by a bent arrow in FIG. 5) in the upper panel and the corresponding potential in the lower panel. The clocking sequence begins with signal charge packet in the clocked well region 68* (an asterisk is appended to the reference number 68 so that consistency with FIGS. 3A-E is maintained: clocked well region 68* abuts virtual barrier 62 and belongs to the pixel above the pixel illustrated in FIG. 3B) and with intercolumn transfer gate 48 at high voltage. When gate 48 voltage goes low, the signal charge packet is pushed through unmodulated virtual barrier region 62 and into the virtual well region 64. When gate 48 again goes high the packet flows across clocked barrier region 66 into clocked well region 68 (see FIG. 3B, this is not shown in FIG. 6). Therefore, each time gate 48 is clocked from low to high and back to low, all charge packets in the column transfer down one row. As the signal charge packets are clocked down the columns, the frame transfer gates 46 are held low to prevent charge from flowing to regions 70 and 72 and sense nodes 74.

Note that frame transfer gate 46 and intercolumn transfer gate 48 can be on the same level of metal and have a gap between them. Because the gap occurs over the virtual well region 64 of the intercolumn CCD, the gap has no influence on the signal charge packets.

When one complete frame of signal charge packets has been loaded into the intercolumn virtual well regions 64 of array 32, sense nodes 74 are preset to a fixed high voltage level as illustrated by level 80 in FIG. 6; the technique for this preset will be described below. Then frame transfer gate 46 is pulsed high and the charge packets flow to the clocked well region 72 surrounding sense node 74. When gate 46 is returned to its low voltage state, the signal charge packet is pushed from the clocked well region 72 onto sense node 74 as suggested by arrows 82 in FIG. 6. The voltage on sense node 74 thus drops towards the ground voltage of ground plane 52 (or substrate 58) from its preset voltage according to the magnitude of the charge packet. The capacitance of node 74 is small compared to the capacitance of the clocked well region 72 because the area of node 74 is small, and the capacitance of flaps 44 with respect to ground plane 52 is small due to the low dielectric constant of air. Thus a large voltage change can be induced on sense node 74; the limit arises from the maximum charge packet magnitude that the virtual well regions 64 can hold which is the product of the capacitance of the virtual well and the voltage difference between the potential of the virtual well when empty and the potential of the virtual barrier (any larger packet will begin to spill back over the virtual barrier during clocking transfer). So if the ratio of the capacitance of node 74/ground is one tenth the capacitance of virtual well/ground, then the typical three volt difference of the potentials of the virtual barrier and virtual well can lead to a thirty volt change on node 74 if a sufficient preset voltage level is available.

Figure 7A:
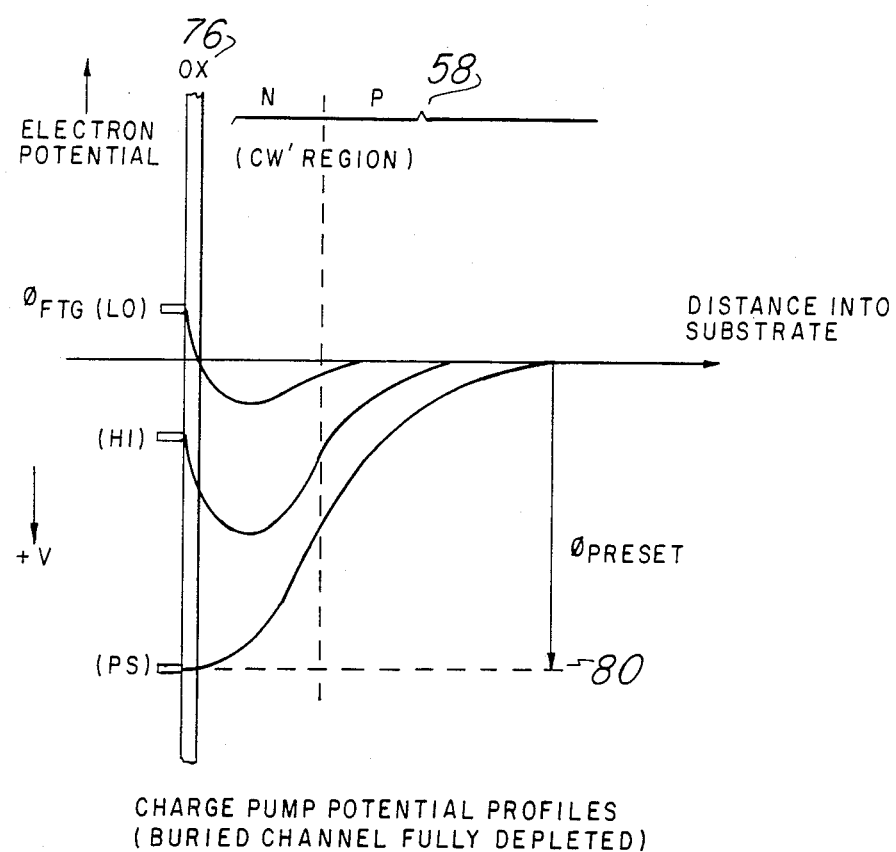
FIGS. 7A-B are conduction band edge diagrams for electrons as a function of distance from the pixel substrate surface for the first preferred embodiment frame addressed spatial light modulator.

Preset of node 74 is accomplished by charge pumping as follows. First, FIG. 7A illustrates the fully depleted potentials (conduction band lower edge) as a function of distance into substrate 58 from a point over clocked well region 72 for three levels of overlying frame transfer gate 46 voltage. The gate 46 level labelled PS represents the flatband condition that determines the maximum preset voltage level 80. The gate 46 level labelled HI represents the voltage at which charge is transferred from the intercolumn CCD channel 50 (at virtual well region 64) to the clocked well region 72, and gate 46 level labelled LO represents the voltage at which holes are attracted to the interface under transfer gate 46.

Figure 7B:
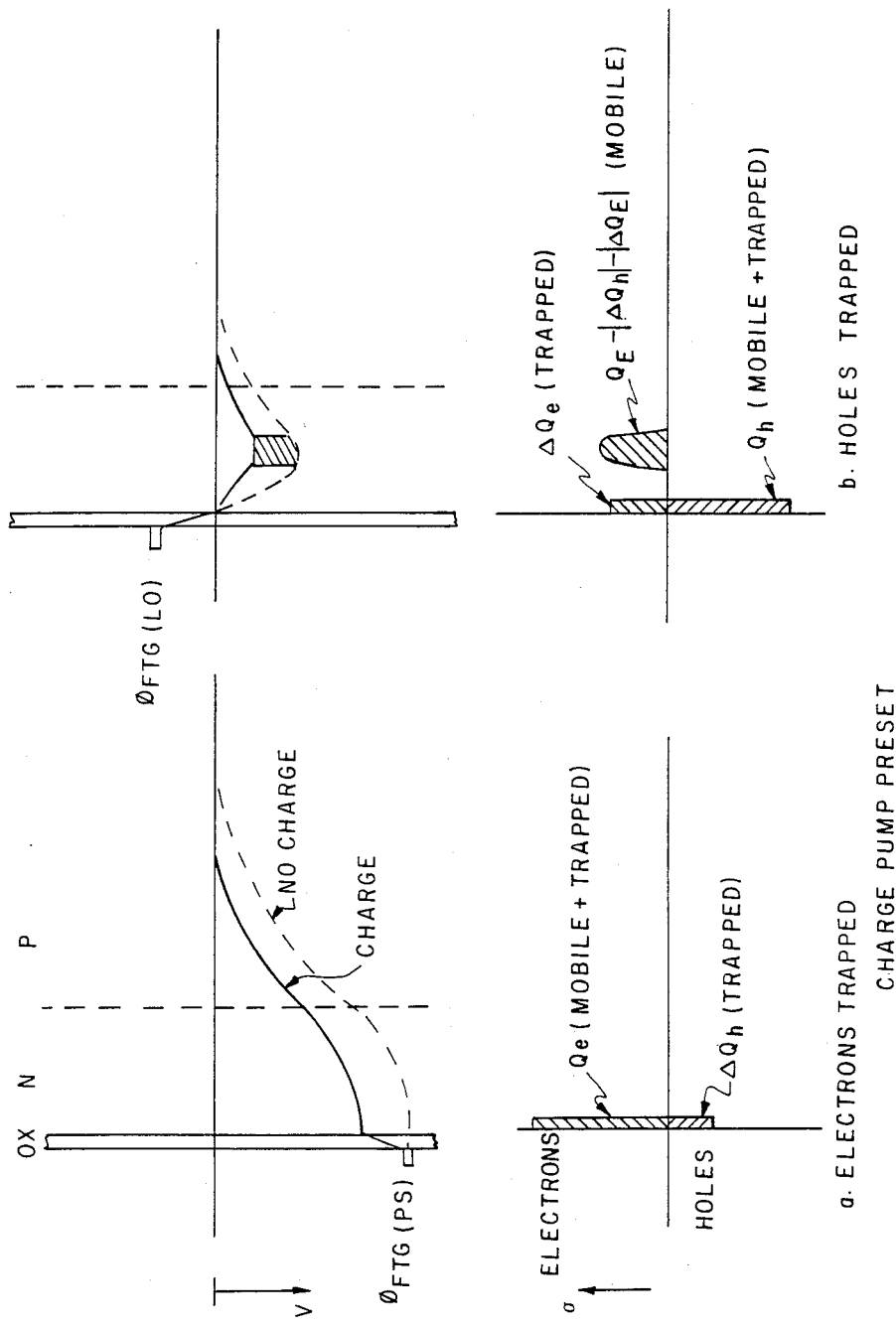

When transfer gate 46 is pulsed to level PS, a quantity of mobile electrons with charge $-Qe$ flows from $n+$ sense node 74 into the well region 72 induced by level PS, see FIG. 7B, left panel, which shows the initial potential as a dotted line and the subsequent potential as a solid line; recall that accumulating charge $-Qe$ provides an electrostatic repulsion for further electrons and thus raises the potential for electrons. Because PS is the flat band condition, all of $-Qe$ accumulates at the interface of insulating layer 76 and substrate 58; in other words, the potential minimum is at the interface for flatband. At the interface an amount $-dQh$ of $-Qe$ recombines with holes trapped from a previous half cycle, as described below, plus an amount $-dQe$ is trapped at the interface. Frame transfer gate 46 is now pulsed to level LO, as illustrated in FIG. 7B, right panel. A quantity of holes of charge Qh moves to the interface where dQe recombine with electrons trapped on the previous half cycle with gate 46 at level PS. Thus mobile electrons of charge $-Qe+dQe+dQh$ from the original $-Qe$ drawn from node 74 are left in the well below region 72 while gate 46 is at voltage level LO; see FIG. 7B, right panel. In short, for each cycle of gate 46 being pulsed to level PS and then pulsed to level LO, a quantity of electrons with charge $-dQe-dQh$ are transferred from node 74 to substrate 58. Once node 74 has been pumped by this cycling of gate 46 to the flatband level 80, no additional charge is transferred to substrate 58. Because the interface trap density varies across a chip and from chip to chip, gate 46 should be pulsed additional times beyond the average number required to preset sense node 74.

Figure 8:
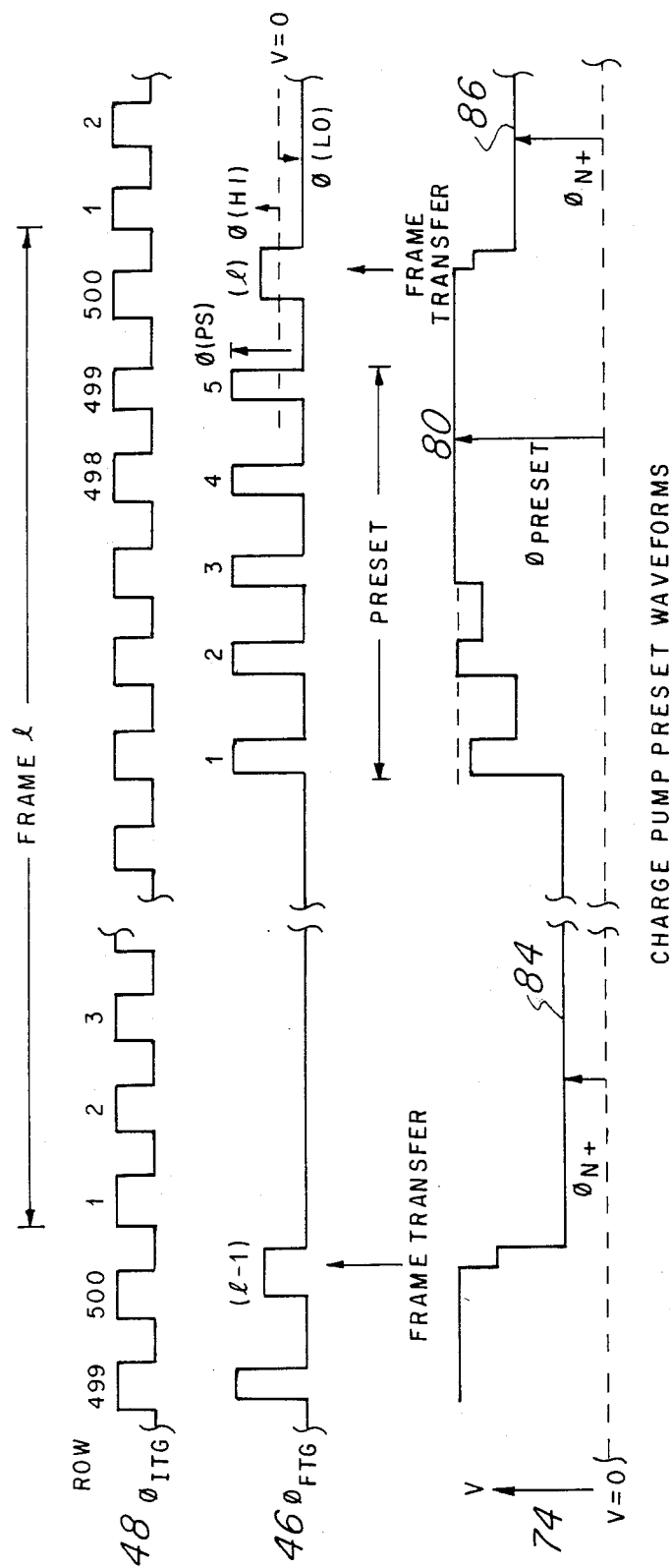
FIG. 8 is a timing diagram for the frame addressing operation of the first preferred embodiment frame addressed spatial light modulator.
Figure 9A:
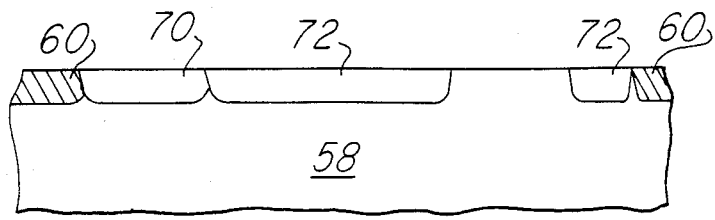
FIGS. 9A-G illustrate a first preferred method of fabrication of the first preferred embodiment frame addressed spatial light modulator.
Figure 9B:
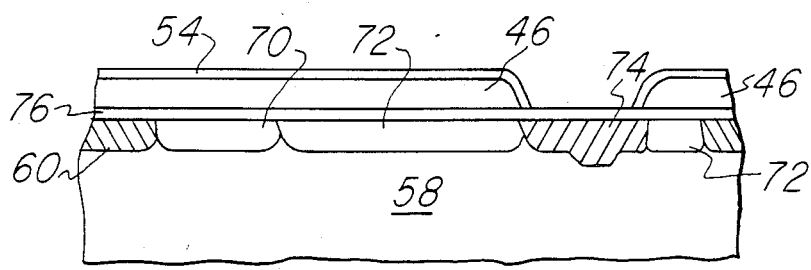
Figure 9C:
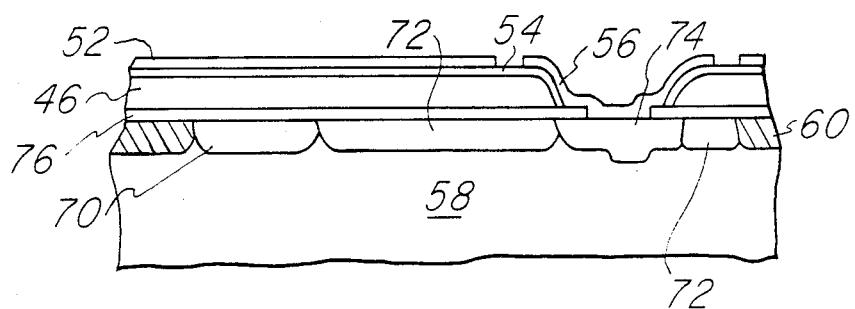
Figure 9D:
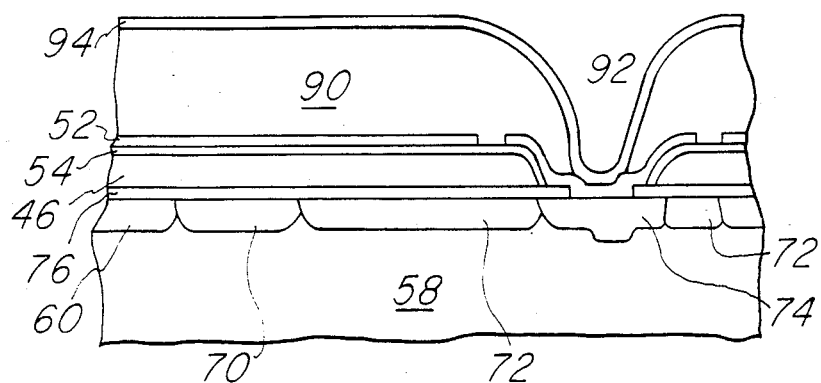
Figure 9E:
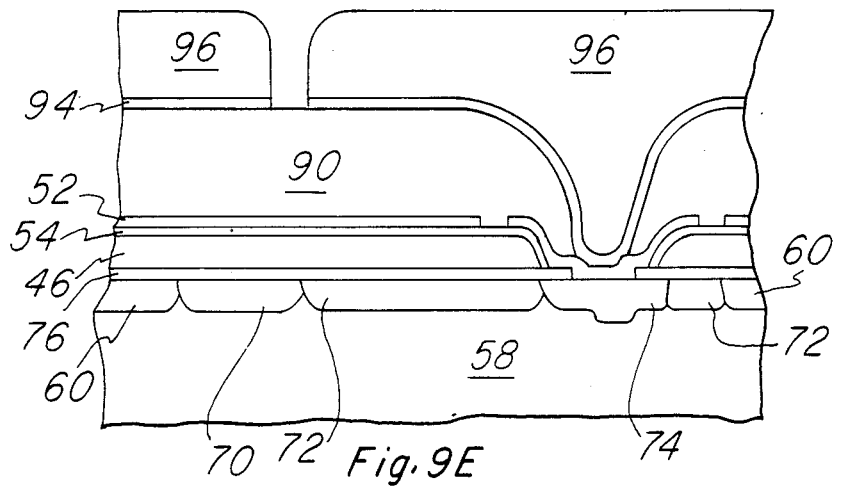
Figure 9F:
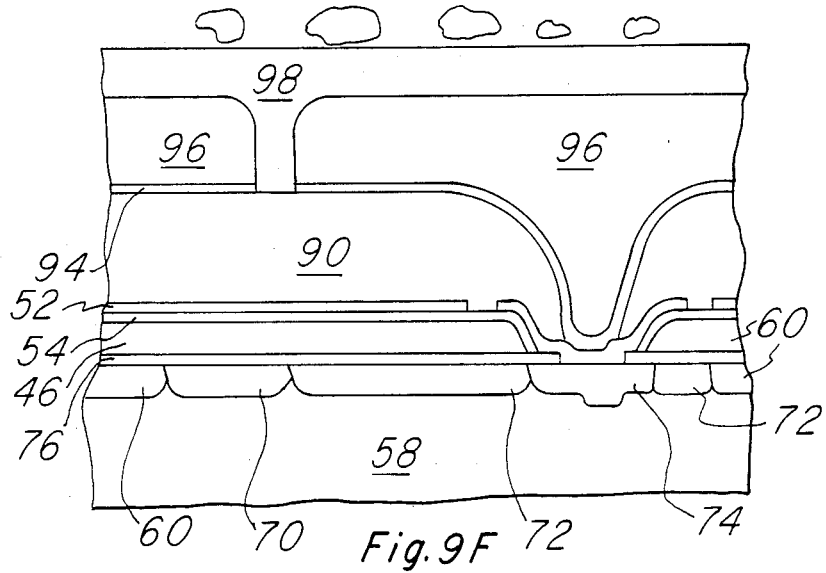
Figure 9G:
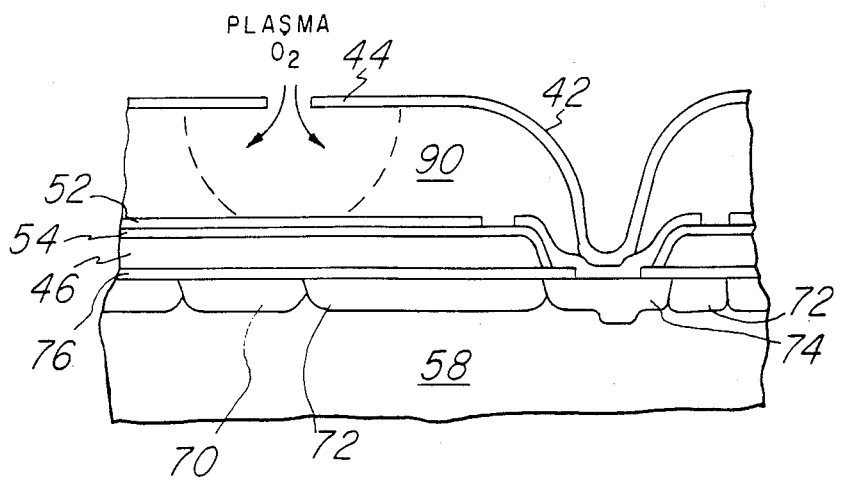

A timing diagram for the foregoing operating is shown in FIG. 8, and illustrates the 500 pulses of intercolumn transfer gate 48 to load the signal charge packets and the five pulses to level PS for preset of nodes 74 and the one pulse to level HI for transfer of signal charge packets onto flaps 44 of frame transfer gate 46 for display of a frame. Note that before intercolumn transfer gate 48 goes low after the 500th pulse, frame transfer gate 46 goes high so that the barrier between the virtual well region 64 of the intercolumn CCD and the clocked well region 72 is removed. When gate 46 then goes low, signal charge flows to virtual well region 64 and then across clocked barrier region 70 into clocked well region 72. Note that the pulsing of gate 46 to preset node 74 is done while gate 48 is high, that is, while the signal charge packets are in the clocked wells region 68 of intercolumn CCD so the virtual wells are empty. Of course, channel stop 60 prevents signal charge packets from transferring directly from the clocked well region 68 into the clocked well region 72. FIG. 8 shows five pulses of gate 46 to level PS for presetting nodes 74; these pulses coming during the last five of the 500 pulses of gate 48 loading a frame of signal charge packets. Thus the voltage on node 74 (and flaps 44) is only affected by the presetting of nodes 74 during the last one percent of the time that a frame is displayed; see the last row of the timing diagram FIG. 8 which illustrates the voltages on node 74 which shows a frame labelled L wherein the illustrated node 74 is at voltage level 84 which changes to level 86 for frame L+1 after some jumping related to the presetting. Note that the first preset pulse of gate 46 to level PS will push the potential of node 74 almost to preset level 80 because the capacitance of the clocked well region 72/ground is much larger than the capacitance of node 74 (plus flaps 44)/ground; but when gate 46 is subsequently pulsed to LO, the unrecombined mobile charge returns to node 74 and its voltage drops. When a sufficient number of preset pulses have been applied, sense node 74 remains a preset level 80 even after gate 46 goes to level LO. By overpulsing during the preset cycle, the preset potential depends only upon the flatband voltage and not the trap density.

Note that the foregoing method of presetting of nodes 74 does not require a surface drain plus preset gate nor a buried drain. This use of gate 46 for both frame transfer and presetting saves substrate area and simplifies fabrication.

The previous discussion of operation of the first preferred embodiment SLM has presumed that the intercolumn CCD and the pixel clocked wells and barriers were initially fully depleted of mobile charge, as is usual in CCD operation. To achieve this depletion upon powering up, it is necessary to clock through many frames as a "warm up"; this warm up can be hastened by clocking converter 34 and intercolumn CCD while applying preset pulses continously on gate 46.

The flatband level PS can be adjusted by modifying the construction of the typical virtual phase buried channel CCD; in particular, making the implant of donors in region 72 less than the implant donors in region 68 decreases the magnitude of level PS. In order to maintain sufficient charge handling capacity in the well region 72, it is necessary to reduce the potential of the clocked barrier region 70 relative to the clocked barrier region 66. This reduction is accomplished by leaving region 70 p silicon (no buried channel blanket implant of phosphorus); this loss of the buried channel is not much concern relative to charge transfer efficiency considerations because charge is transferred across barrier 70 only once per frame. Note the potential levels illustrated in FIG. 6 show well 68* lower than well 72 if both gates 46 and 48 are low or if both gates 46 and 48 are high.

Ground plane 52 may be biased relative to ground (substrate 58 bulk) in order to decrease the voltage required for a desired degree of deflection of flaps 44. Further, if the flatband voltage level PS is beyond the collapse voltage of flaps 44, then a positive dc bias may be applied to ground plane 52 to reduce the maximum voltage across the air gap from ground plane 52 to flaps 44. Also, note that flaps 44 and ground plane 52 both being made of metal implies that an overdriven flap 44 collapsed onto ground plane 52 will be discharged and able to return to the undeflected position without incident.

FIGS. 9A-G illustrate in cross sectional elevation view a first preferred embodiment method of fabricating the first preferred embodiment SLM with the following steps. (1) Start with a (100) oriented p silicon substrate 58 with a carrier density of 1E15 per cubic centimeter. (2) Mask and implant arsenic, phosphorus and boron to form regions 60, 62, 64, 66, 68, 70, and 72 for all pixels; see FIG. 9A. (3) Grow oxide 76, deposit n+ polysilicon (and silicide if needed to lower resistance) and pattern and etch it to form transfer gates 46 and 48. Open up node region 74, mask, and implant phosphorus to form self-aligned (by gate 46) n+ node 74; and grow oxide 54 on gates 46 and 48. See FIG. 9B. (4) Pattern and etch the oxide to open up node regions 74; deposit aluminum and pattern and etch it to form ground plane 52 and contact 56 to node regions 74; see FIG. 9C. (5) Spin on a planarizing spacer 90 (such as positive photoresist) to a thickness equal to the desired distance between ground plane 52 and flaps 44 and pattern it to open up holes 92 for support posts 42; and sputter deposit aluminum 94; see FIG. 9D. (6) Spin on photoresist 96 and pattern it to define the gaps between and the perimeters of flaps 44; plasma etch the exposed aluminum (for example, with a mixture of chlorine, boron trichloride, and silicon tetrachloride); see FIG. 9E. (7) Spin on a layer 98 of polymethyl methacrylate (PMMA) to act as a protective layer during subsequent dicing steps; dice substrate 58 into chips (each ship will become an SLM); see FIG. 9F in which dicing debris is suggested. (8) Dissolve PMMA 98 in chlorobenzene and centrifuge to remove the dicing debris, note that photoresist 96 and 90 will not dissolve in chlorobenzene; plasma etch the chips in oxygen to remove photoresist 96 and 90, and thereby form the pixels and SLM; see FIG. 9G. Note that serial to parallel converter 34 is also a buried channel CCD device and is fabricated simultaneously with the charge transfer portions of the pixels and on the same silicon substrate.

FIGS. 10A-B illustrate alternative data input structures for increasing the rate of intercolumn transfer. The maximum intercolumn transfer rate corresponds to the rate at which significant charge transfer losses occur for the intercolumn CCD shift register. This rate could be as high as 20 MHz. However, the CCD serial to parallel converter 34 must run at a rate which is the product of intercolumn rate times the number of columns. Therefore, the input rate is the limiting factor. For the 500 by 500 pixel SLM of FIG. 2A, an increase in the intercolumn rate from 10 KHz to 100 KHz would require an increase in converter 34's input rate from 5 MHz to 50 MHz. To reduce the input rate for a given intercolumn rate, multiple inputs can be employed as shown in FIG. 10A where an intercolumn transfer rate is 100 KHz with ten channels each having an input rate of 5 MHz. In FIG. 10B the intercolumn transfer rate is 1 MHz and derives from twenty-five inputs each with a 20 MHz input rate. To provide the proper time delay between the inputs, an off-chip GaAs serial to parallel converter 35 is shown having twenty-five output taps and an input rate of 500 MHz.

Other modifications of the preferred embodiment device are immediate and include variations of dimensions, number of pixels, materials (such as titanium instead of copper for alloying with the aluminum for the flaps), processing techniques (such as wet etching in place of dry), architecture (such as a single flap per support post—this means an asymmetrical arrangement), structure (such as support posts and flaps fabricated in two steps to insure a thick support post but still thin, flexible hinges to the flaps), use of multiphase CCDs in lieu of virtual phase, use of charge drain lines instead of charge pumping to reset the nodes and flaps at the beginning of each frame, and so forth.

I claim:

1. A frame addressed spatial light modulator, comprising:
(a) a two dimensional array of pixels on a substrate and arranged into columns, each of said pixels including (i) a column transfer portion, (ii) a sense portion adjacent said column transfer portion, (iii) a conducting layer over at least a part of said portion, and (iv) at least one deflectable reflecting flap connected to said sense portion and over but insulated from said layer;
(b) a column transfer gate for transferring signals from the column transfer portion of a pixel to the column transfer portion of an adjacent pixel in the same column; and
(c) a sense transfer gate for transferring signals from the column transfer portion of a pixel to the sense portion of the same pixel.

2. The modulator of claim 1, wherein:
(a) said column transfer portions of the pixels in one of said columns together form a CCD.

3. The modulator of claim 2, wherein:
(a) said CCD is a buried channel, virtual phase CCD; and
(b) said column transfer gate is the clocked gate for said buried channel, virtual phase CCD.

4. The modulator of claim 1, wherein:
(a) said sense portion includes (i) a node region to which said flap is connected and (ii) a potential well region adjacent said node region; and
(b) said sense transfer gate directly controls the potential in said potential well region but not in said node region.

5. The modulator of claim 4, further comprising:
(a) circuitry for applying preset voltage pulses to said sense transfer gate and pumping charge from said node region by repeatedly lowering the potential in said potential well region to withdraw charge from said node region to recombine with trapped charge of opposite sign followed by raising the potential to recharge said trapped charge.

6. The modulator of claim 1, further comprising:
(a) circuitry for biasing said conducting layer with respect to said substrate.

7. A frame addressed spatial light modulator, comprising:
(a) a plurality of parallel CCDs on a substrate;
(b) a plurality of sense nodes on said substrate, each of said nodes adjacent one of said CCDs;
(c) at least one frame transfer gate for transferring change packets from potential wells in said CCDs to said nodes; and
(d) a plurality of electrostatically deflectable reflecting flaps conductively supported by flap supports on said nodes, each of said nodes connected to at least one of said flap supports.

8. The modulator of claim 7, further comprising: p1 (a) at least one ground plane between at least one of said flaps and said substrate including said CCDs and said transfer gate(s), said ground plane(s) insulated from said flaps, supports, and nodes.

9. The modulator of claim 7, wherein:
(a) said CCDs are buried channel, virtual phase CCDs.

10. The modulator of claim 7, wherein:
(a) said frame transfer gates may be biased sufficiently to pump essentially all of a charge packet from said nodes, supports and flaps into said substrate and thereby preset said nodes, supports, and flaps for another frame of charge packets.

11. The modulator of claim 8, wherein:

(a) said ground planes are insulated from said substrate, CCDs, and transfer gates and may be biased with respect to said substrate.

12. A frame addressed spatial light modulator, comprising:
(a) an array of pixels on a substrate and arranged into columns;
(b) charge transfer devices on said substrate for transferring signal charge packets down said columns;
(c) a serial to parallel converter on said substrate, the outputs of said converter connected to said charge transfer devices;
(d) frame transfer gates on said substrate for transferring signal charge packets from said columns to said pixels essentially simultaneously for all pixels; and
(e) said pixels characterized by a sense node on said substrate connected to at least one electrostatically deflectable, reflecting flap supported on said substrate.

13. The modulator of claim 12, further comprising:
(a) at least one ground plane, each of said ground planes(s) between at least one of said flaps and said substrate including said transfer gates and charge transfer devices and each of said ground plane(s) insulated to be biased (positive, negative, or zero) with respect to said substrate.

14. The modulator of claim 12, further comprising:
(a) circuitry for applying preset voltage pulses to said frame transfer gate and pumping charge from said sense node by repeatedly lowering the potential in a portion of said pixel adjacent said node to withdraw charge from said node to recombine with trapped charge of opposite sign followed by raising the potential to recharge said trapped charge.

15. An image projection system for electronic image data, comprising:
(a) a light source;
(b) a spatial light modulator of said data;
(c) an optical system for directing light from said source onto said modulator and for projecting modulated light from said modulator onto a projection screen; and
(d) said modulator including:
(i) a plurality of parallel CCDs on a substrate;
(ii) a plurality of sense nodes on said substrate, each of said nodes adjacent one of said CCDs;
(iii) at least one frame transfer gate for transferring charge packets from potential wells in said CCDs to said nodes;
(iv) a plurality of electrostatically deflectable reflecting flaps conductively supported by flap supports on said nodes, each of said nodes connected to at least one of said flap supports; and
(v) a converter for inputting said data into said CCDs.

16. The system of claim 15, further comprising:
(a) circuitry for applying preset voltage pulses to said frame transfer gate(s) and pumping charge from each of said nodes by for each node repeatedly lowering the potential in a region adjacent to said each node to withdraw charge from said each node to recombine with trapped charge of opposite sign followed by raising the potential to recharge said trapped charge.

17. An optical processor for electronic data, comprising:
(a) a light source;
(b) a spatial light modulator for said data;
(c) an optical system for directing light from said source onto said modulator and for converting modulated light from said modulator into electronic output; and
(d) said modulator including:
(i) a plurality of parallel CCDs on a substrate;
(ii) a plurality of sense nodes on said substrate, each of said nodes adjacent one of said CCDs;
(iii) at least one frame transfer gate for transferring charge packets from potential weels in said CCDs to said nodes;
(iv) a plurality of electrostatically deflectable reflecting flaps conductively supported by flap supports on said nodes, each of said nodes connected to at least one of said flap supports; and
(v) a converter for inputting said data into said CCDs.

18. The processor of claim 17, further comprising:
(a) circuitry for applying preset voltage pulses on said frame transfer gate(s) and pumping charge from each of said nodes by for each node repeatedly lowering the potential in a region adjacent to said each node to withdraw charge from said each node to recombine with trapped charge of opposite sign followed by raising the potential to recharge said trapped charge.

* * * * *